US009157964B2

(12) United States Patent
Kitsunai et al.

(10) Patent No.: US 9,157,964 B2
(45) Date of Patent: Oct. 13, 2015

(54) METHOD FOR PRODUCING SECONDARY BATTERY

(75) Inventors: Shinichiro Kitsunai, Okazaki (JP); Kazuo Ikuta, Kariya (JP); Norihiro Jikuri, Okazaki (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 381 days.

(21) Appl. No.: 13/497,257

(22) PCT Filed: Sep. 24, 2009

(86) PCT No.: PCT/JP2009/004819
§ 371 (c)(1),
(2), (4) Date: Mar. 21, 2012

(87) PCT Pub. No.: WO2011/036705
PCT Pub. Date: Mar. 31, 2011

(65) Prior Publication Data
US 2012/0176140 A1 Jul. 12, 2012

(51) Int. Cl.
G01N 27/416 (2006.01)
G01R 31/36 (2006.01)
H01M 10/052 (2010.01)
H01M 10/42 (2006.01)
G01R 31/02 (2006.01)

(52) U.S. Cl.
CPC ......... *G01R 31/3627* (2013.01); *H01M 10/052* (2013.01); *H01M 10/4207* (2013.01); *G01R 31/025* (2013.01); *Y02E 60/122* (2013.01)

(58) Field of Classification Search
CPC .................................. H01M 10/4285
USPC ........... 324/426; 320/134–136, 150, 153–154
See application file for complete search history.

(56) References Cited

U.S. PATENT DOCUMENTS 5,712,795 A * 1/1998 Layman et al. ............... 324/426
6,563,318 B2 * 5/2003 Kawakami et al. .......... 324/426

FOREIGN PATENT DOCUMENTS

JP 9-17458 1/1997
JP 2000-30747 1/2000
JP 2002-352864 12/2002

(Continued)

OTHER PUBLICATIONS

International Search Report in International Application No. PCT/JP2009/004819; Mailing Date: Jan. 12, 2010.

*Primary Examiner* — Drew A Dunn
*Assistant Examiner* — Zixuan Zhou
(74) *Attorney, Agent, or Firm* — Finnegan, Henderson, Farabow, Garrett & Dunner, LLP

(57) ABSTRACT

Disclosed is method for producing a secondary battery, capable of selection of a secondary battery having a defect caused by a micro short-circuit with high accuracy. A step for producing a secondary battery includes an inspection step for selecting the secondary battery having the defect among multiple secondary batteries. In the inspection step, a short circuit resistance is calculated based on capacitances of the multiple secondary batteries calculated before self-discharge inspection, a time required for the self-discharge inspection, first and second reference voltages calculated from open circuit voltages measured before and after the self-discharge inspection in the multiple secondary batteries, and first and second voltages which are open circuit voltages of one selected from the multiple secondary batteries measured before and after the self-discharge inspection. If the short circuit resistance is equal to or lower than a predetermined standard value, the selected secondary battery is determined to have the defect.

2 Claims, 7 Drawing Sheets

(56) References Cited

FOREIGN PATENT DOCUMENTS

| JP | 2003-317810 | 11/2003 |
| JP | 2004-132776 | 4/2004 |
| JP | 2004-288515 | 10/2004 |
| JP | 2008-97857 | 4/2008 |
| JP | 2009-4389 | 1/2009 |

* cited by examiner

METHOD FOR PRODUCING SECONDARY BATTERY

CROSS-REFERENCE TO RELATED APPLICATIONS

This application is a national phase application of International Application No. PCT/JP2009/004819, filed Sep. 24, 2009, the contents of which are incorporated herein by reference.

TECHNICAL FIELD

The present invention relates to a method for producing a secondary battery, particularly to a technique for selecting a secondary battery having a defect caused by a micro short-circuit.

BACKGROUND ART

In the conventional method for producing a secondary battery such as a lithium-ion secondary battery and a Ni-MH secondary battery, an electrode body is made by laminating and winding a positive electrode sheet, a negative electrode sheet and separators interposed therebetween, and the electrode body is housed in a case. The electrode body is impregnated with an electrolytic solution in the case, and followed by predetermined steps such as a self-discharge and an aging.

As to the conventional production step of the secondary battery as mentioned above, JP 2004-132776 A discloses an inspection step performed to select a secondary battery with a micro short-circuit (defective product).

As shown in FIG. 9, an inspection step S100 for selecting the defective products from the plurality of secondary batteries is performed.

In the inspection step S100, first, a terminal voltage before the aging V0 and a terminal voltage after the aging V1 are measured (step S101), and a difference between them is calculated as a voltage difference ΔV in each of the secondary batteries (step S102).

Next, an average of the voltage difference ΔV between the terminal voltage V0 and the terminal voltage V1 that are calculated in each of the secondary batteries is calculated as an average value ΔVA (step S103). Moreover, a reference value ΔVB of the defective product is set (step S104).

Finally, a value obtained by subtracting the reference value ΔVB from the average value ΔVA is compared with the voltage difference ΔV in each of the secondary batteries (step S105), in the case where the voltage difference ΔV is lower than the value, the secondary battery as the test object is determined as the defective product (step S106), and otherwise, the secondary battery is determined as an acceptable product (step S107).

However, in JP 2004-132776 A, the micro short-circuit in the secondary battery is not determined by a physical explanation, that is, an explanation with an equivalent circuit, and the defective product is selected on the basis of the micro short-circuit considered as a decrement of voltage caused by the self-discharge, so that accuracy of the inspection is low, and an erroneous determination might be incurred.
[Patent Literature 1] JP 2004-132776 A

DISCLOSURE OF INVENTION

Problem to Be Solved By the Invention

The objective of the present invention is to provide unexpected method for producing a secondary battery enabled to select a secondary battery having a defect caused by a micro short-circuit with high accuracy.

Means for Solving the Problem

The first embodiment of the present invention is a method for producing a secondary battery, which includes an inspection step for selecting the secondary battery having a defect caused by a micro short-circuit among a plurality of the secondary batteries, in which the inspection step includes a self-discharge inspection in which the plurality of the secondary batteries are allowed to stand at normal temperature for a predetermined period, and in which in the inspection step, a short circuit resistance of said each secondary battery is calculated on the basis of states before and after the self-discharge inspection, and the defect caused by the micro short-circuit is determined on the basis of the short circuit resistance in said each secondary battery.

In the advantageous embodiment of the method for producing a secondary battery, the short circuit resistance is calculated from a following formula 4 by using a capacitance of said each secondary battery calculated before the self-discharge inspection, a time required for the self-discharge inspection, a first reference voltage calculated from open circuit voltages of the plurality of the secondary batteries measured before the self-discharge inspection, a second reference voltage calculated from open circuit voltages of the plurality of the secondary batteries measured after the self-discharge inspection, a first voltage which is the open circuit voltage of one secondary battery selected from the plurality of the secondary batteries measured before the self-discharge inspection, and a second voltage which is the open circuit voltage of the selected secondary battery measured after the self-discharge inspection, and in the case where the short circuit resistance is equal to or lower than a predetermined standard value, the selected secondary battery is determined to have the defect caused by the micro short-circuit.

$$Rs = t/C \cdot \ln\{Vs1 \cdot Vi0/(Vs0 \cdot Vi1)\} \quad \text{[Formula 4]}$$

$R_s$: short circuit resistance
t: inspection time
C: capacitance
$V_{i0}$: first reference voltage
$V_{i1}$: second reference voltage
$V_{s0}$: first voltage
$V_{s1}$: second voltage In the preferable embodiment of the method for producing a secondary battery, the first reference voltage is a smaller value of an average and a median of the open circuit voltages of the plurality of the secondary batteries measured before the self-discharge inspection, and the second reference voltage is a larger value of an average and a median of the open circuit voltages of the plurality of the secondary batteries measured after the self-discharge inspection.

In the more preferable embodiment of the method for producing a secondary battery, the first reference voltage and the second reference voltage constitute the smaller value of an average and a median of values obtained by dividing the open circuit voltages of the plurality of the secondary batteries measured before the self-discharge inspection by the open circuit voltages of the plurality of the secondary batteries measured after the self-discharge inspection.

Effect of the Invention

According to the present invention, a secondary battery having a defect caused by a micro short-circuit is selected

REFERENCE SIGNS LIST

Figure 1:
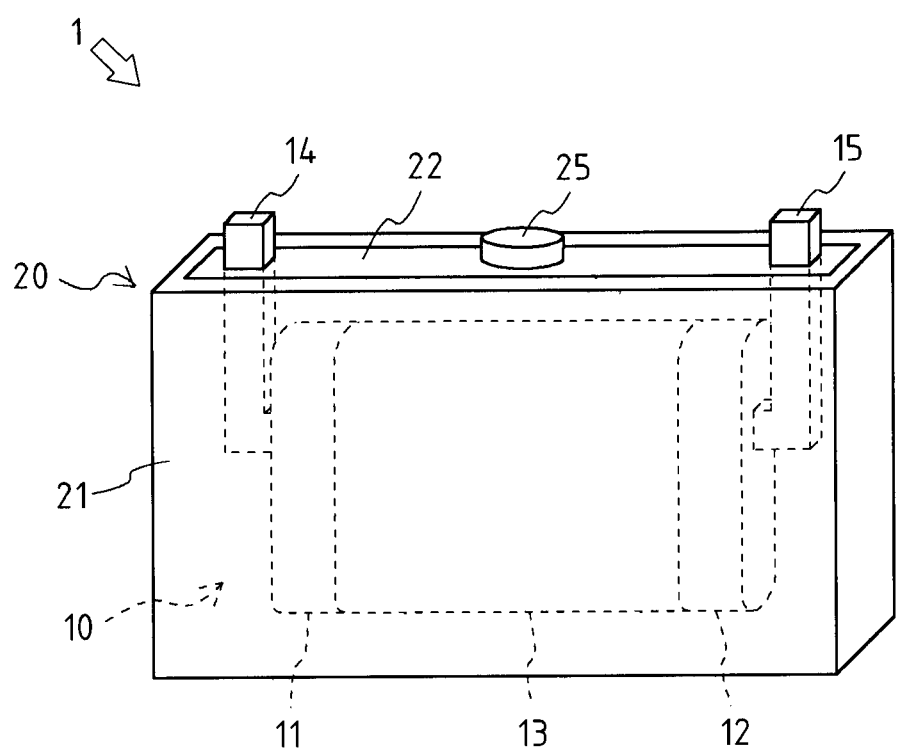
FIG. 1 is a perspective view of a secondary battery.

1: secondary battery
10: electrode body
11: positive electrode
12: negative electrode
13: separator
20: case
30: clamping device

THE BEST MODE FOR CARRYING OUT THE INVENTION

With reference to FIG. 1, a secondary battery 1 as an embodiment of the present invention is described below.

As shown in FIG. 1, the secondary battery 1 has an electrode body 10 and a case 20 encasing the electrode body 10 therein. The secondary battery is a chargeable and dischargeable battery such as a lithium-ion secondary battery and a Ni-MH secondary battery, by pouring an electrolytic solution to the case 20 and impregnating the electrolytic solution into the electrode body 10.

The electrode body 10 is made by laminating a positive electrode 11 and a negative electrode 12 with a separator 13 in between and by winding them flatly. The electrode body becomes an electricity-generation element by impregnating the electrolytic solution thereinto.

The positive electrode 11 is made by coating a pasty compound including a positive-electrode active material on a surface of a positive-electrode collector that is a metallic foil made of aluminum, titanium, stainless steel and the like, by drying, by pressing with rollers and the like.

The negative electrode 12 is made by coating a pasty compound including a negative-electrode active material on a surface of a negative-electrode collector that is a metallic foil made of copper, nickel, stainless steel or the like, by drying, by pressing with rollers and the like.

The separator 13 is an insulator made of a polyolefin resin such as polyethylene and polypropylene, and is arranged between the positive electrode 11 and the negative electrode 12.

The positive electrode 11 and the negative electrode 12 in the electrode body 10 are electrically connected to a positive terminal 14 and a negative terminal 15 that are connection paths to exchange the electrical energy with the outside of the secondary battery 1. The electrode body 10 is encased in the case 20 with the positive terminal 14 and the negative terminal 15 projecting upward (upper direction in FIG. 1) from the case 20.

The case 20 is a square metal can made of aluminum, stainless steel or the like, and is an outer cover of the secondary battery 1 to house the electrode body 10 and the electrolytic solution therein. The case 20 is composed of a storage part 21 whose top face (one face located the upper side in FIG. 1) is open, and a lid part 22 that covers the open face of the storage part 21.

The storage part 21 is a box member shaped as substantially rectangular parallelepiped whose top face is open, and the electrode body 10 is encased into the inside of the storage part 21 through the open face.

The lid part 22 is a plate member having the shape corresponding to the open face of the storage part 21. In the lid part 22, holes through which the positive terminal 14 and the negative terminal 15 can penetrate are formed, and by placing the positive terminal 14 and the negative terminal 15 in those holes and by fixing the positive terminal 14 and the negative terminal 15 to those holes, the positive terminal 14 and the negative terminal 15 are fixed, penetrating so as to project toward the outside of the case 20.

As mentioned above, in the secondary battery 1, the electrode body 10 is made by laminating the positive electrode 11 and the negative electrode 12 with the separator 13 in between and by winding them, the electrode body 10 impregnated with the electrolytic solution is encased in the case 20 sealed up, and the positive terminal 14 and the negative terminal 15 connected to the positive electrode 11 and the negative electrode 12 of the electrode body 10 are arranged so as to project toward the outside of the case 20 from the lid part 22.

With reference to FIGS. 2 to 8, a production step S1 for producing the secondary battery 1 is described below.

Figure 2:
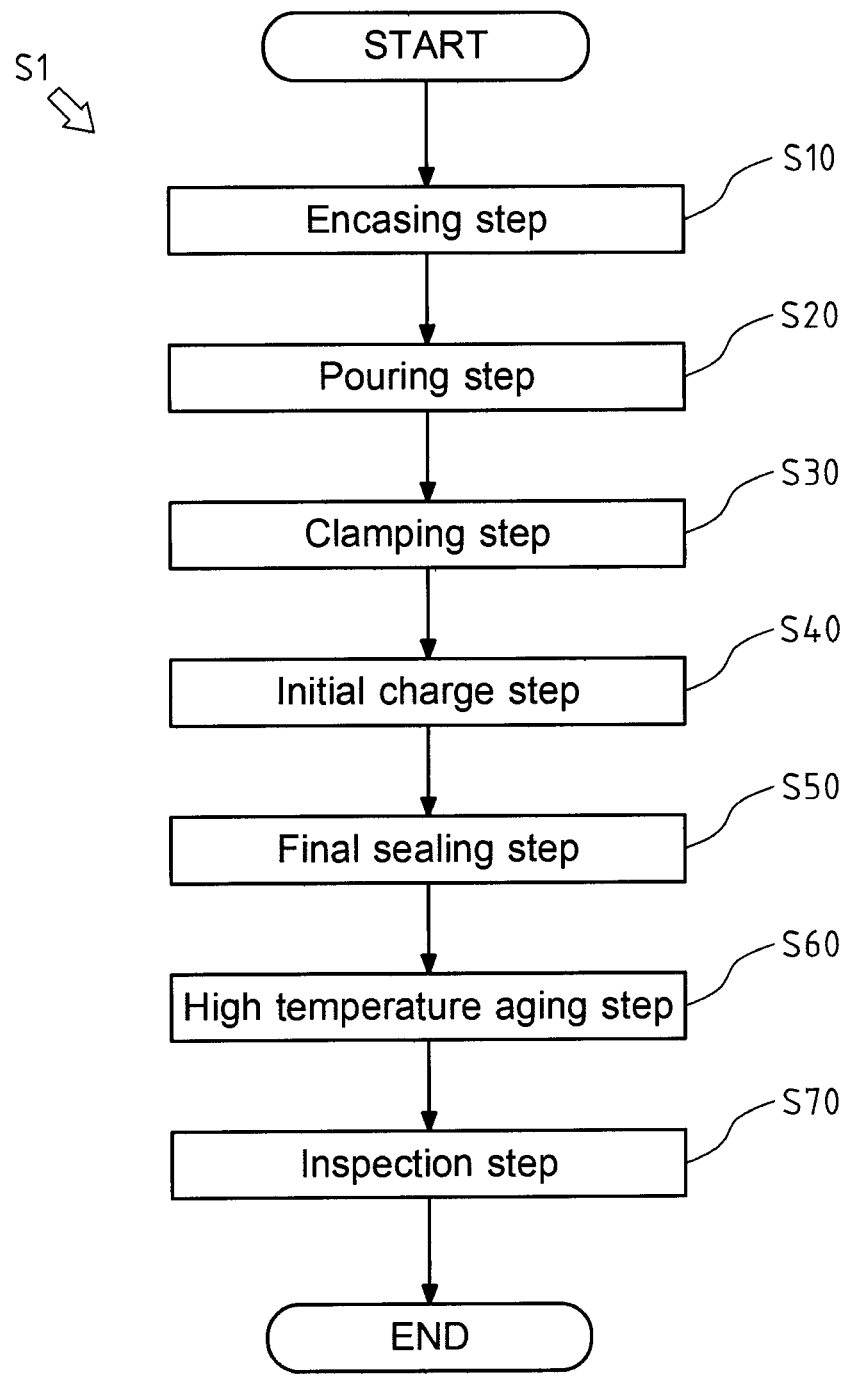
FIG. 2 is a flowchart showing a method for producing the secondary battery.

As shown in FIG. 2, the production step S1 includes an encasing step S10, a pouring step S20, a clamping step S30, an initial charge step S40, a final sealing step S50, a high temperature aging step S60 and an inspection step S70.

The encasing step S10 is a step for encasing the electrode body 10 in the case 20.

Figure 3:
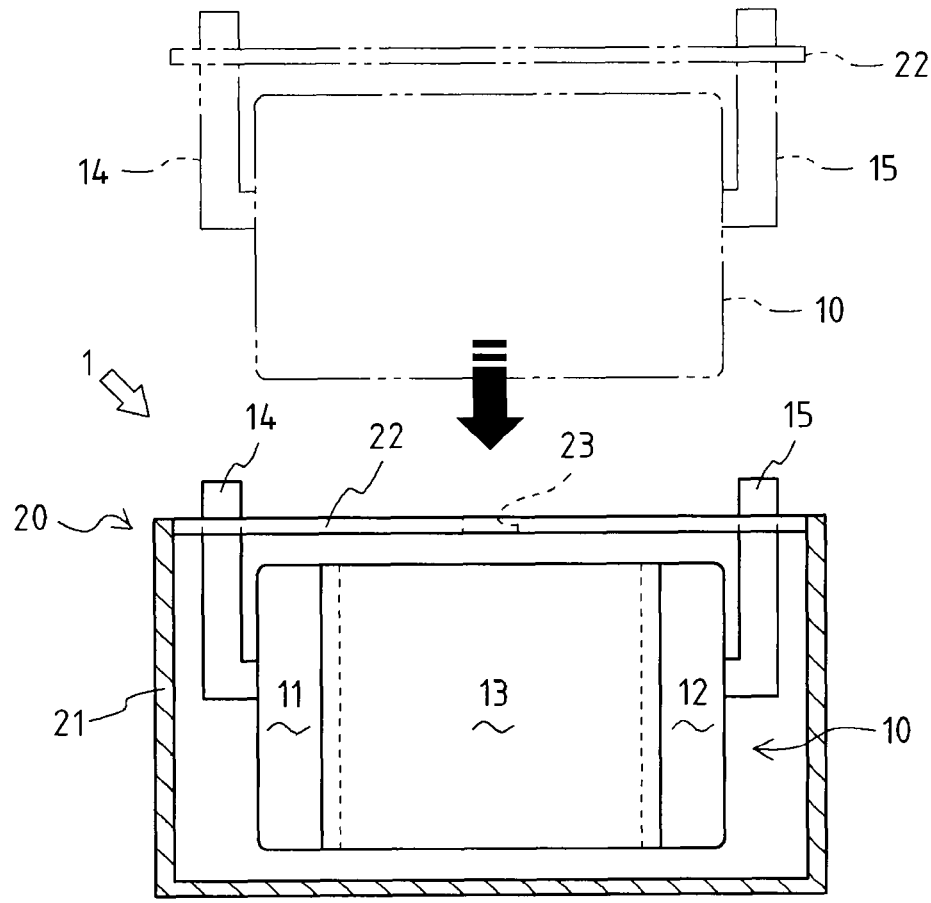
FIG. 3 shows an electrode body encased in a case.

As shown in FIG. 3, in the encasing step S10, one end of the positive terminal 14 and one end of the negative terminal 15 are connected to the positive electrode 11 and the negative electrode 12 of the electrode body 10 respectively, and the other end of the positive terminal 14 and the other end of the negative terminal 15 are penetrated through the lid part 22. They are integrated, and the electrode body 10 is encased in the storage part 21 through the open face of the storage part 21. After the electrode body 10 is encased in the storage part 21, the open face of the storage part 21 is covered by the lid part 22, and the storage part 21 and the lid part 22 are joined mutually by welding.

In the present embodiment, the electrode body 10 is produced before the encasing step S10, and the electrode body 10 is a publicly known article used for a general secondary battery, so that a detailed description of a method for producing the electrode body 10 is omitted.

The pouring step S20 is a step for pouring the electrolytic solution into the case 20 in which the electrode body 10 is encased in the encasing step S10.

Figure 4:
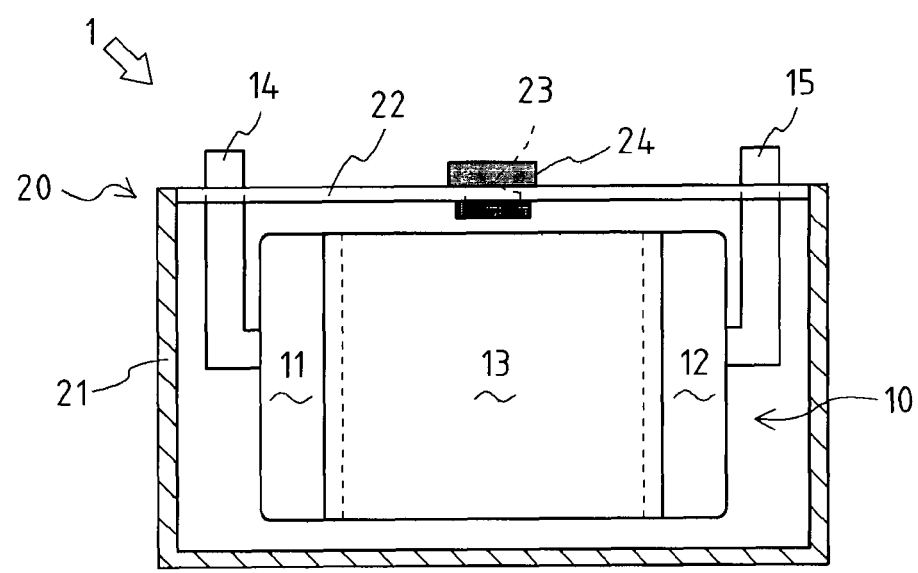
FIG. 4 shows a temporary sealing of the secondary battery.

As shown in FIG. 4, in the pouring step S20, the electrolytic solution is poured through a pouring opening 23 opening at a center of the lid part 22 along a thickness direction of the lid part 22 (top-bottom direction in FIG. 4). After that, the pouring opening 23 of the lid part 22 is temporarily sealed by a rubber stopper 24. The pouring step S20 is performed at a dew point of −30° C.

The rubber stopper 24 is made of an ethylene propylene diene terpolymer (EPDM), a polychloroprene, a butyl rubber, a silicone rubber, a fluoro rubber or the like, has resistance to the electrolytic solution and gas, and has a property of fitting the lid part 22.

The electrolytic solution is a solution that is made by dissolving a supporting electrolyte such as LiPF6, LiClO4 and LiBF4 in a mixed organic solvent consisting of cyclic carbonates such as an ethylene carbonate (EC), a propylene carbonate (PC) and vinylene carbonate (VC), and chain carbonates such as dimethyl carbonate (DMC), diethyl carbonate (DEC) and ethyl methyl carbonate (EMC).

The clamping step S30 is a step for clamping the secondary battery 1 in which the electrolytic solution is poured in the pouring step S20 at a predetermined pressure.

Figure 5:
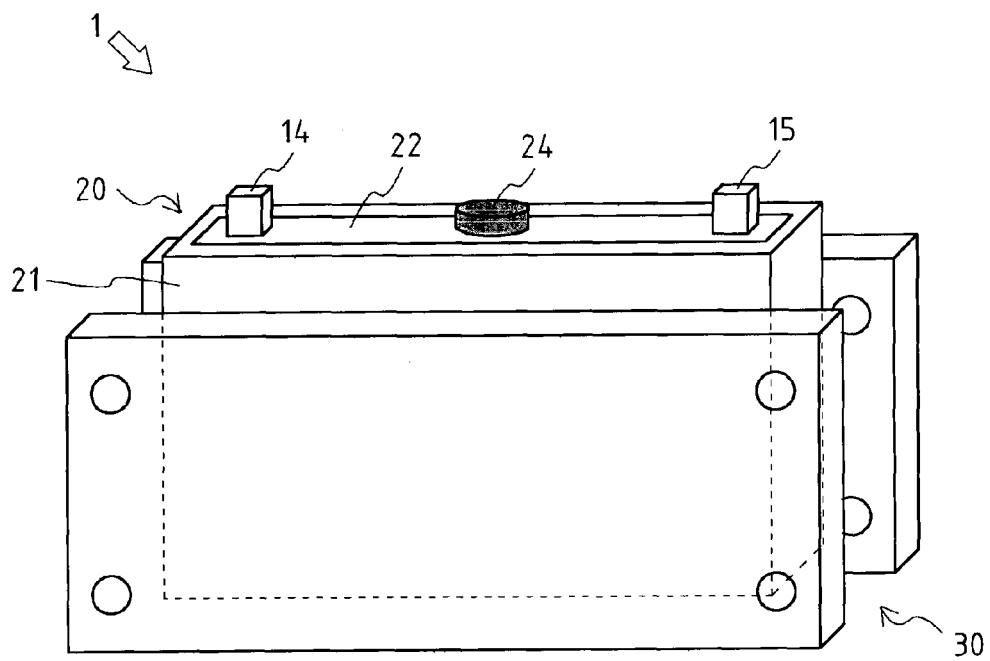
FIG. 5 shows a clamping of the secondary battery.

As shown in FIG. 5, in the clamping step S30, the secondary battery 1 is clamped at the clamping pressure of 0.8 MPa by a clamping device 30 that clamps wide surfaces of the case 20 from both sides. The clamping device 30 presses the opposite sides of the case 20 and clamps the secondary battery 1.

The clamping device 30 can clamp the secondary battery 1 at the desired clamping pressure, and can measure the actual clamping pressure.

In the case where the clamping pressure of the clamping device 30 is too low, the clamping force does not reach every part of the electrode body 10 and dispersion of voltage occurs in the electrode body 10. Therefore, it is desirable that the clamping pressure of the clamping device 30 is 0.2 MPa or more. In the case where the clamping pressure of the clamping device 30 is too high, a flaw can occur at the joined part of the storage part 21 and the lid part 22 in the case 20. Moreover, in the case where the strength of the separator 13 having an ion-permeability and an electric insulation-property is exceeded, a voltage holding property in open circuit state may lose. Therefore, it is desirable that an upper limit of the clamping pressure of the clamping device 30 is set in consideration of the joined strength of the storage part 21 and the lid part 22 in the case 20, the strength of the separator 13 and the like.

The initial charge step S40 is a step for performing an initial charge of the secondary battery 1 clamped in the clamping step S30.

In the initial charge step S40, the positive terminal 14 and the negative terminal 15 of the secondary battery 1 clamped with the clamping device 30 are connected to a suitable power supply, and the initial charge of the secondary battery 1 is performed. At this time, as an ion as a charge carrier such as lithium ion is intercalated in the negative electrode 12, the clamping pressure increases due to an expansion of the electrode body 10 and the voltage of the secondary battery 1 increases, so that a termination condition of the initial charge of the secondary battery 1 is decided on the basis of the clamping pressure. Concretely, it is desirable that the initial charge of the secondary battery 1 terminates when the clamping pressure reaches 0.5 MPa or more (e.g. 1.1 MPa). Besides, the termination condition of the initial charge of the secondary battery 1 may be decided on the basis of the voltage. Concretely, it is desirable that the initial charge is terminated when the voltage is within the value such that the electrolytic solution decomposes and is about the value such that a final chemical reaction peaks between the positive electrode 11 and the negative electrode 12 (e.g. 4.10 plus/minus 0.02 V).

The final sealing step S50 is a step for releasing gas in the secondary battery 1 generated in the initial charge in the initial charge step S40, and for performing a final sealing to the pouring opening 23.

Figure 6:
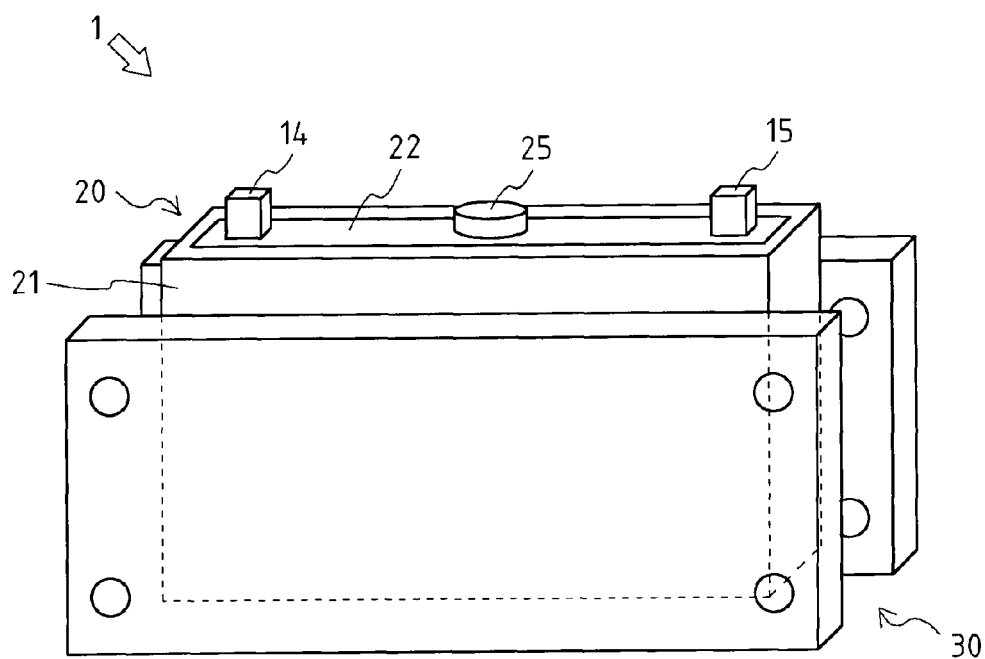
FIG. 6 shows a final sealing of the secondary battery.

As shown in FIG. 6, in the final sealing step S50, the rubber stopper 24 is pulled out of the pouring opening 23 that is temporarily sealed by the rubber stopper 24 and the pouring opening 23 is unsealed, whereby the gas generated in the secondary battery 1 in the initial charge is released. Then a metallic sealing member 25 is placed so as to cover the pouring opening 23 (see FIG. 4), the pouring opening 23 is completely closed, and the sealing member 25 and the lid part 22 are welded mutually, whereby the final sealing of the pouring opening 23 of the lid part 22 is performed. The final sealing step S50 is performed at a dew point of −30° C.

After the final sealing of the pouring opening 23 by the sealing member 25, the clamping of the secondary battery 1 by the clamping device 30 is temporarily released, a leakage inspection of the electrolytic solution in the secondary battery 1 is performed, the secondary battery 1 is clamped by the clamping device 30 again, and the next step is performed.

The high temperature aging step S60 is a step for aging the secondary battery 1 that the final sealing is performed in the final sealing step S50 at a high temperature.

In the high temperature aging step S60, the aging of the secondary battery 1 at a high temperature (e.g. 500° C.) is performed for a predetermined period (e.g. 15 hours).

The inspection step S70 is a step for selecting the defective product from the secondary batteries 1 that the aging is performed at the high temperature in the high temperature aging step S60.

In the inspection step S70, a self-discharge inspection in which the secondary batteries 1 as the test objects after the encasing step S10 to the high temperature aging step S60 are allowed to stand at normal temperature (e.g. 25° C.) for a predetermined period (e.g. 10 days) is performed, and the secondary batteries 1 are classified into the secondary batteries 1 (defective products) in which a micro short-circuit appears to occur and the normal secondary batteries 1 (acceptable products) on the basis of the states before and after the self-discharge inspection.

Figure 7:
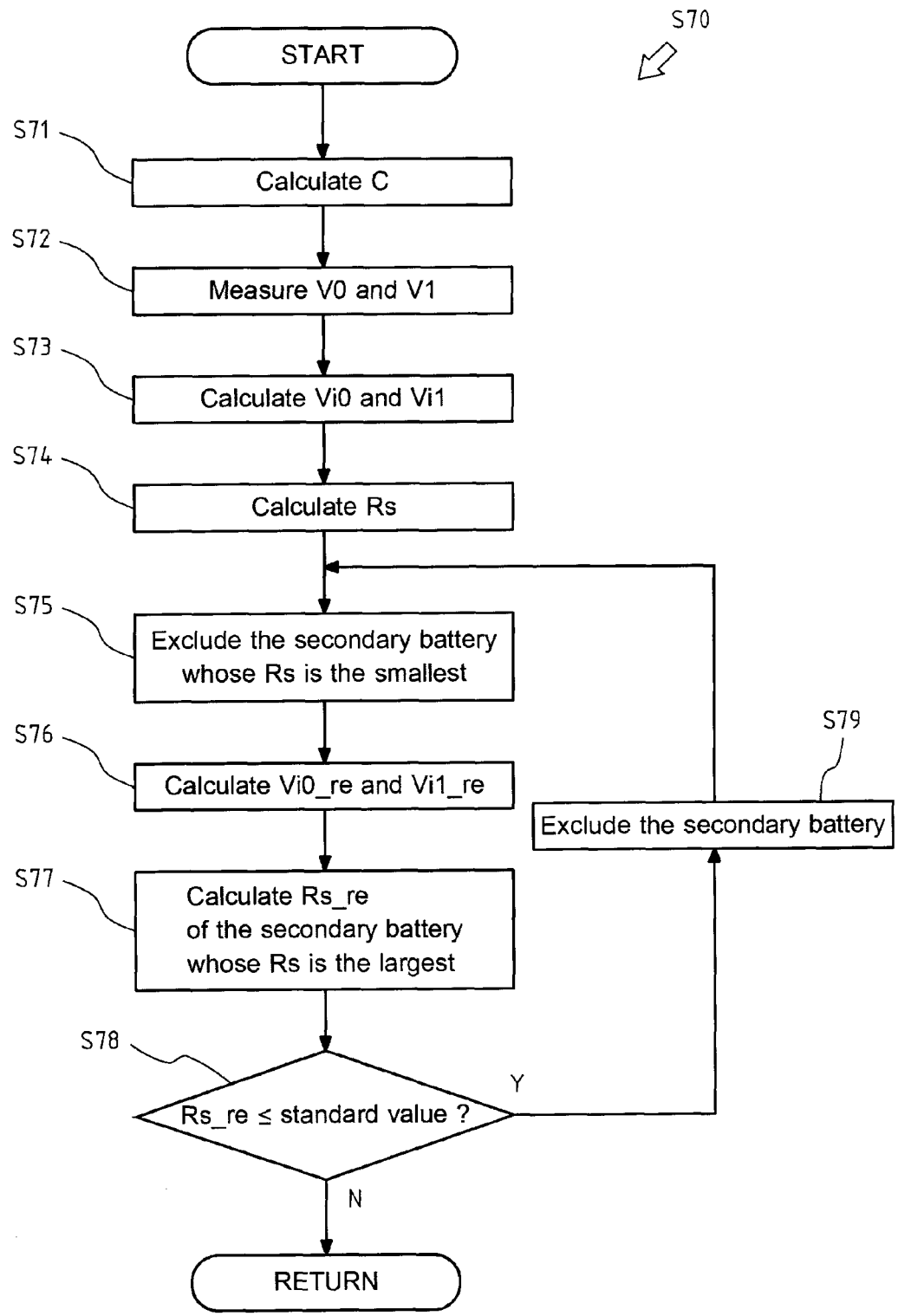
FIG. 7 is a flowchart showing an inspection step.

As shown in FIG. 7, first, a capacitance C of every secondary battery 1 is calculated (step S71).

The capacitance C is calculated from a following formula 1 on the basis of time and electric current required to pass a range of voltage in the self-discharge that are found from a charging curve in the initial charge.

$$C = I/(dV/dt)$$ [Formula 1]

C: capacitance
I: electric current in constant-current charge
V: voltage
t: time After the capacitances C are calculated, in every secondary battery 1, a voltage V0 that is an open circuit voltage before the self-discharge inspection is measured, and a voltage V1 that is an open circuit voltage after the self-discharge inspection is measured after the self-discharge inspection is performed (step S72).

At this time, in the case where each of the voltage V0 and the voltage V1 is lower than a predetermined lower limit, the secondary battery 1 may be considered as the defective product and be excluded from the test objects. Here, the predetermined lower limit is the voltage such that the secondary battery 1 as the test object is determined as the defective product.

After the voltage V0 and the voltage V1 are measured, in every secondary battery 1, a first reference voltage Vi0 and a second reference voltage Vi1 are calculated on the basis of the voltage V0 and the voltage V1 (step S73).

The first reference voltage Vi0 is the smaller value of an average and a median of the voltages V0 in all the secondary batteries 1, and the second reference voltage Vi1 is the larger value of an average and a median of the voltages V1 in all the secondary batteries 1.

The first reference voltage Vi0 and the second reference voltage Vi1 may also be calculated as shown below.

The average and the median of the voltage V0/the voltage V1 are calculated, and the voltage V0 and the voltage V1 that constitute the smaller value of them are defined as the first reference voltage Vi0 and the second reference voltage Vi1, respectively.

After the first reference voltage Vi0 and the second reference voltage Vi1 are calculated, a short circuit resistance Rs is calculated in every secondary battery 1 (step S74).

Here, the short circuit resistance Rs is a value equivalent to the micro short-circuit in the secondary battery 1 considered as resistance.

Figure 8:
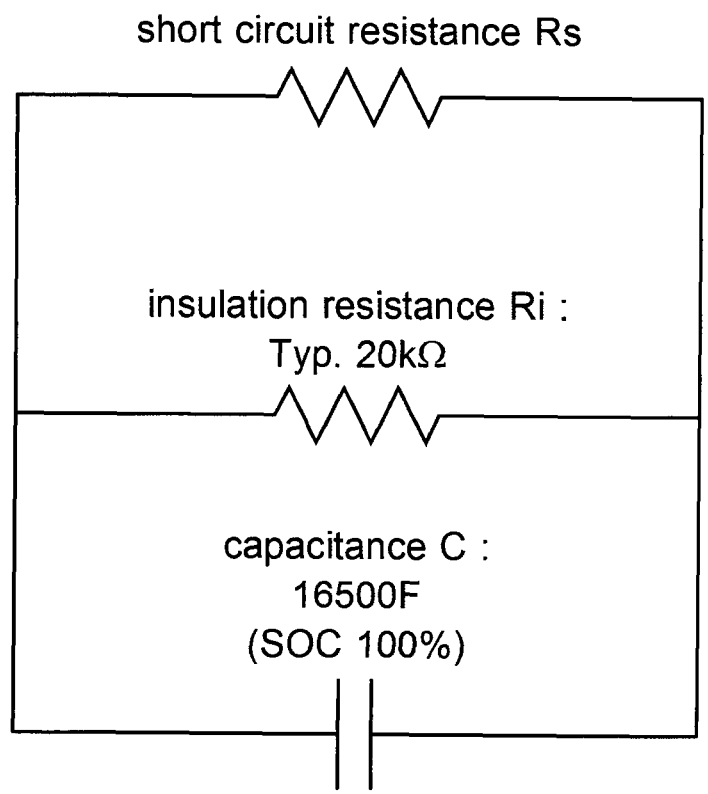
FIG. 8 is shows a circuit diagram that simulates a secondary battery having a micro short-circuit.

As shown in FIG. 8, when the micro short-circuit in the secondary battery 1 is represented with an equivalent circuit, namely when a constant-resistance discharge of a condenser component at the resistance is simulated, following formula 2 and formula 3 are executed.

Note that the numerical values in FIG. 8 are only an example.

$$V_i = V0 \cdot \exp\{-t/(C \cdot R_i)\} \quad \text{[Formula 2]}$$

t: inspection time
C: capacitance
$R_i$: insulation resistance $$V_{i+s} = V0 \cdot \exp\{-t/(C \cdot R_{i+s})\} \quad \text{[Formula 3]}$$

t: inspection time
C: capacitance
$R_{i+s}$: combined resistance of short circuit and insulation On the basis of the formula 2 and the formula 3, a formula 4 for calculating the short circuit resistance Rs is derived as shown below.

$$Rs = t/C \cdot \ln\{Vs1 \cdot Vi0/(Vs0 \cdot Vi1)\} \quad \text{[Formula 4]}$$

$R_s$: short circuit resistance
t: inspection time
C: capacitance
$V_{i0}$: first reference voltage
$V_{i1}$: second reference voltage
$V_{s0}$: first voltage
$V_{s1}$: second voltage In the case where the short circuit resistance Rs is calculated with the formula 4, the voltage V0 and the voltage V1 of the secondary battery 1 as a subject whose short circuit resistance Rs is calculated are substituted for a first voltage Vs0 and a second voltage Vs1, respectively, and time required for the self-discharge inspection is substituted for an inspection time t.

By substituting these values, and the capacitance C, the first reference voltage Vi0 and the second reference voltage Vi1 that are calculated as mentioned above for the formula 4, the short circuit resistance Rs is calculated for each of the secondary batteries 1.

As for the capacitance C, in consideration of dispersion of the capacitance C in every secondary battery 1, the capacitance C of each of the secondary batteries 1 may be used, or in disregard of dispersion of the capacitance C in every secondary battery 1, a constant value (e.g. average of the capacitances C of all the secondary batteries 1) may be used for all the secondary batteries 1.

After the short circuit resistances Rs of all the secondary batteries 1 are calculated, the secondary battery 1 whose short circuit resistance Rs is the smallest in these secondary batteries 1 is excluded from the test objects (step S75).

Because in the case where the short circuit resistance Rs is comparatively small, the scale of the short-circuit is comparatively large, the secondary battery 1 whose short circuit resistance Rs is the smallest is considered as the defective product and is excluded from the test objects after that.

After the secondary battery 1 considered as the defective product is excluded, on the basis of the voltages V0 and the voltages V1 of all the remaining secondary batteries 1, the first reference voltage Vi0 and the second reference voltage Vi1 are calculated again, and the first reference voltage Vi0 and the second reference voltage Vi1 calculated again are defined as a first reference voltage Vi0_re and a second reference voltage Vi1_re, respectively (step S76).

Because a method for calculating the first reference voltage Vi0 and the second reference voltage Vi1 again is equal to the above-mentioned method, the details are omitted.

After the first reference voltage Vi0_re and the second reference voltage Vi1_re are calculated, by use of these values, the short circuit resistance Rs of the secondary battery 1 whose short circuit resistance Rs is the largest is calculated again, and the short circuit resistance Rs calculated again is defined as a short circuit resistance Rs_re (step S77).

In the recalculation of the short circuit resistance Rs, the formula 4 is used.

After the short circuit resistance Rs_re is calculated, the short circuit resistance Rs_re is compared with a predetermined standard value (step S78).

Here, the predetermined standard value is a resistance value such that the micro short-circuit is determined to occur in the secondary battery 1.

In the case where the short circuit resistance Rs_re is equal to or smaller than the predetermined standard value, this secondary battery 1 having is considered as the defective product, is excluded from the test objects after that (step S79), and after returning to the step S75, the same process is repeated.

In the case where the short circuit resistance Rs_re is larger than the predetermined standard value, this secondary batteries 1 and the remaining secondary batteries 1 are considered as the acceptable products, and the inspection step S70 is terminated.

As mentioned above, through the production step S1 in which the encasing step S10, the pouring step S20, the clamping step S30, the initial charge step S40, the final sealing step S50, the high temperature aging step S60 and the inspection step S70 are performed in order, the secondary batteries 1 are produced.

If the defective product is selected by calculating the short circuit resistance Rs of the secondary battery 1 as the test object with the formula 4 and by comparing the short circuit resistance Rs with the predetermined standard value, the inspection step S70 is not limited to the present embodiment.

An effect that occurs by producing the secondary battery 1 through the production step S1 is described below on the basis of examples 1 to 3 and a comparative example 1 according to the present invention.

Example 1

Sixty same secondary batteries that underwent the encasing step S10 to the high temperature aging step S60 were prepared. Each of ten secondary batteries of them was connected to a resistor of 430 kΩ as micro short-circuit resistance, and was simulated as the defective product. Namely, the fifty acceptable products and the ten defective replicas were produced.

First, the sixty secondary batteries were allowed to stand at 25° C. for 10 days, and the self-discharge inspection was performed.

Then, the voltage V0 as the open circuit voltage before the self-discharge inspection and the voltage V1 as the open circuit voltage after the self-discharge inspection were measured in every secondary battery 1.

Next, the capacitances C were calculated as shown below.

A range of voltage in the self-discharge inspection was from 4.070 to 4.060 V, and on the basis of time and electric current required to pass this range that were found from a charging curve in the initial charge, the capacitance C of each of the fifty acceptable products was calculated from the formula 1. The capacitance C was set to 15870 F because the capacitances C of the fifty acceptable products had little dispersion.

Then, a median and an average of the voltage V0/the voltage V1 in each of the fifty acceptable products were calculated, the voltage V0 and the voltage V1 that constitute the smaller value of them are defined as the first reference voltage Vi0 and the second reference voltage Vi1, respectively.

Finally, the short circuit resistance Rs of each of the ten defective replicas was calculated from the formula 4. The voltage V0 and the voltage V1 of the defective replica as a subject whose short circuit resistance Rs was calculated were substituted for the first voltage Vs0 and the second voltage Vs1, respectively.

As mentioned above, the short circuit resistances Rs of the defective replicas were calculated, and a percentage error between the short circuit resistances Rs and the resistance values of the resistors connected to the defective replicas (430 kΩ) was calculated.

Example 2

In the present example, except that the smaller value of an average and a median of the voltages V0 of the fifty acceptable products was defined as the first reference voltage Vi0, and the larger value of an average and a median of the voltages V1 of the fifty acceptable products was defined as the second reference voltage Vi1 when the first reference voltage Vi0 and the second reference voltage Vi1 were calculated, the short circuit resistances Rs of the defective replicas were calculated, and the percentage error between the short circuit resistances Rs and the resistance values of the resistors connected to the defective replicas (430 kΩ) was calculated by the same method as the example 1.

Example 3

In the present example, except that the capacitance C of each of the ten defective replicas was calculated when the capacitances C were calculated and that the capacitance C of each of the defective replicas was used when the short circuit resistances Rs of the defective replicas were calculated, the percentage error between the short circuit resistances Rs of the defective replicas and the resistance values of the resistors connected to the defective replicas (430 kΩ) was calculated by the same method as the example 1.

Comparative Example 1

Figure 9:
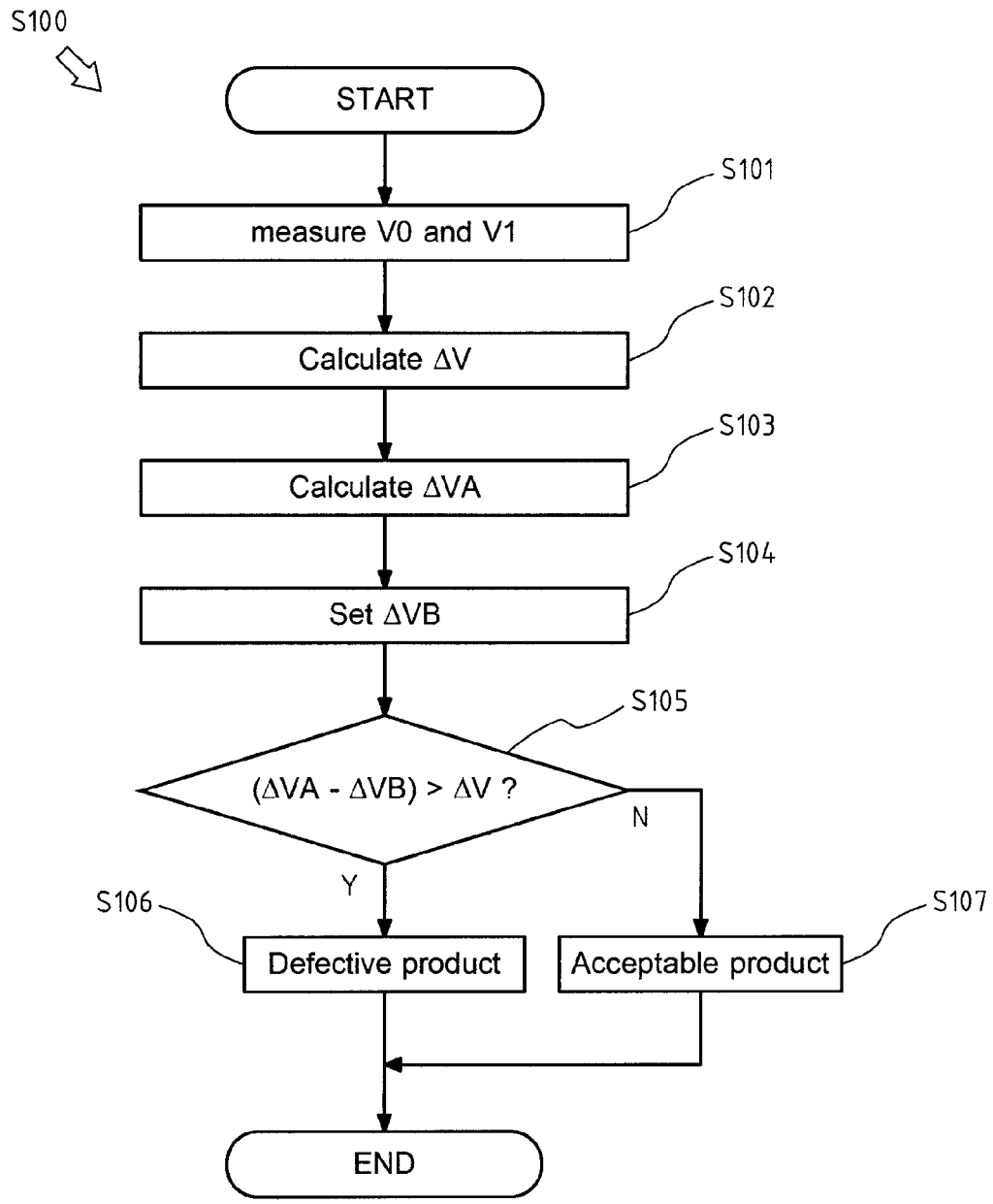
FIG. 9 is a flowchart showing a conventional inspection for selecting a defective product.

In the present comparative example, an prior art shown in FIG. 9 was reproduced on the present invention, and the percentage error between the short circuit resistances Rs of the defective replicas and the resistance values of the resistors connected to the defective replicas (430 kΩ) was calculated.

In detail, (Vi1−Vi0)−(Vs1−Vs0) was applied as a value corresponding to ΔVA−ΔVB shown in FIG. 9. Here, in the prior art shown in FIG. 9, a value obtained by subtracting voltage after the self-discharge (aging) from voltage before the self-discharge (aging) was used to select the defective products. Accordingly, the Vi0 and the Vs0 shown in the formula 4 were considered nonexistent and the short circuit resistances Rs of the defective replicas were calculated to reproduce a selection of the defective products by subtraction of voltage before and after the self-discharge (aging) like the prior art on the present invent.

As mentioned above, their percentage error between the short circuit resistances Rs of the defective replicas and the resistance values of the resistors connected to the defective replicas (430 kΩ) that were calculated in the example 1 to 3 and the comparative example 1 were described in a following table 1.

TABLE 1

| | percentage error of inspection result of defective replicas |
|---|---|
| example 1 | 3.10% |
| example 2 | 3.04% |
| example 3 | 3.02% |
| comparative example 1 | 5.09% |

As shown in table 1, the percentage error in the comparative example 1 was about 5 percent, whereas every percentage error in the example 1 to 3 was about 3 percent. Namely, compared with the prior art, the percentage error could be improved about 2 percent by applying the present invention. Therefore, it became clear that the secondary batteries having a defect caused by the micro short-circuit could be selected with high accuracy according to the present invention.

INDUSTRIAL APPLICABILITY

The present invention is applied to a step for producing a secondary battery, especially to a step for producing a secondary battery including a self-discharge inspection.

The invention claimed is:

1. A method for producing a secondary battery, comprising:
   an inspection step for selecting the secondary battery having a defect caused by a micro short-circuit among a plurality of the secondary batteries,
   wherein the inspection step includes a first step for performing a self-discharge inspection in which the plurality of the secondary batteries are allowed to stand at normal temperature for a predetermined period, a second step for calculating a short circuit resistance of said each secondary battery, and a third step for determining the defect caused by the micro short-circuit on the basis of the short circuit resistance in said each secondary battery,
   wherein in the second step, the short circuit resistance Rs is calculated from a formula $Rs = t/C \cdot \ln\{Vs1 \cdot Vi0/(Vs0 \cdot Vi1)\}$ by using a capacitance C of said each secondary battery calculated before the self-discharge inspection, a time t required for the self-discharge inspection, a first reference voltage Vi0 calculated from open circuit voltages of the plurality of the secondary batteries measured before the self-discharge inspection, a second reference voltage Vi1 calculated from the open circuit voltages of the plurality of the secondary batteries measured after the self-discharge inspection, a first voltage Vs0 which is the open circuit voltage, measured before the self-discharge inspection, of one secondary battery selected from the plurality of the secondary batteries, and a second voltage Vs1 which is the open circuit voltage of the selected secondary battery measured after the self-discharge inspection, wherein in the third step, if the short circuit resistance is equal to or lower than a predetermined standard value, the selected secondary battery is determined to have the defect caused by the micro short-circuit, wherein the first reference voltage is a smaller value of an average and a median of the open circuit voltages of the plurality of the secondary batteries measured before the self-discharge inspection, and wherein the second reference voltage is a larger value of an average and a median of the open circuit voltages of the plurality of the secondary batteries measured after the self-discharge inspection.

2. A method for producing a secondary battery, comprising:

an inspection step for selecting the secondary battery having a defect caused by a micro short-circuit among a plurality of secondary batteries, wherein the inspection step includes a first step for performing a self-discharge inspection in which the plurality of the secondary batteries are allowed to stand at normal temperature for a predetermined period, a second step for calculating a short circuit resistance of said each secondary battery, and a third step for determining the defect caused by the micro short-circuit on the basis of the short circuit resistance in said each secondary battery, wherein in the second step, the short circuit resistance Rs is calculated from a formula $Rs = t/C \cdot \ln\{Vs1 \cdot Vi0/(Vs0 \cdot Vi1)\}$ by using a capacitance C of said each secondary battery calculated before the self-discharge inspection, a time t required for the self-discharge inspection, a first reference voltage Vi0 calculated from open circuit voltages of the plurality of the secondary batteries measured before the self-discharge inspection, a second reference voltage Vi1 calculated from the open circuit voltages of the plurality of the secondary batteries measured after the self-discharge inspection, a first voltage Vs0 which is the open circuit voltage, measured before the self-discharge inspection, of one secondary battery selected from the plurality of the secondary batteries, and a second voltage Vs1 which is the open circuit voltage of the selected secondary battery measured after the self-discharge inspection, wherein in the third step, if the short circuit resistance is equal to or lower than a predetermined standard value, the selected secondary battery is determined to have the defect caused by the micro short-circuit, wherein the first reference voltage is the open circuit voltage measured before the self-discharge inspection, which constitutes the smaller value of an average and a median of values obtained by dividing the open circuit voltages of the plurality of the secondary batteries measured before the self-discharge inspection by the open circuit voltages of the plurality of the secondary batteries measured after the self-discharge inspection, and wherein the second reference voltage is the open circuit voltage measured after the self-discharge inspection, which constitutes the smaller value of the average and the median of the values obtained by dividing the open circuit voltages of the plurality of the secondary batteries measured before the self-discharge inspection by the open circuit voltages of the plurality of the secondary batteries measured after the self-discharge inspection.

* * * * *